(12) United States Patent
Isono

(10) Patent No.: US 9,345,140 B2
(45) Date of Patent: May 17, 2016

(54) PRINTED CIRCUIT BOARD

(71) Applicant: CANON KABUSHIKI KAISHA, Tokyo (JP)

(72) Inventor: Hiroshi Isono, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/855,233

(22) Filed: Sep. 15, 2015

(65) Prior Publication Data

US 2016/0007466 A1 Jan. 7, 2016

Related U.S. Application Data

(63) Continuation of application No. 13/863,631, filed on Apr. 16, 2013, now Pat. No. 9,185,804.

(30) Foreign Application Priority Data

Apr. 19, 2012 (JP) .................................. 2012-096100

(51) Int. Cl.
*H01R 9/00* (2006.01)
*H05K 1/18* (2006.01)
*H01L 25/065* (2006.01)
*H05K 1/11* (2006.01)
*H05K 1/02* (2006.01)

(52) U.S. Cl.
CPC ............ *H05K 1/181* (2013.01); *H01L 25/0657* (2013.01); *H05K 1/0243* (2013.01); *H05K 1/0298* (2013.01); *H05K 1/115* (2013.01);
(Continued)

(58) Field of Classification Search
CPC ........... H01L 2224/16225; H01L 2225/06548; H01L 2225/06555; H01L 25/0657; H01L 2924/15174; H05K 1/0228; H05K 1/0231; H05K 1/0243; H05K 1/0298; H05K 1/115; H05K 1/181; H05K 2201/09654; H05K 2201/1054
USPC .................. 361/760, 764, 767, 777, 775, 774; 174/255, 257, 258, 260, 261, 262
See application file for complete search history.

(56) References Cited

U.S. PATENT DOCUMENTS 5,763,947 A * 6/1998 Bartley ............. H01L 23/49816
257/691
5,898,217 A * 4/1999 Johnston ........... H01L 23/49822
257/690

(Continued)

FOREIGN PATENT DOCUMENTS

JP 2000-031329 A 1/2000
JP 2005-191355 A 7/2005

(Continued)

*Primary Examiner* — Yuriy Semenenko
(74) *Attorney, Agent, or Firm* — Canon USA, Inc. I.P. Division

(57) ABSTRACT

A printed circuit board includes a first semiconductor package on a first surface layer of a printed wiring board and a second semiconductor package on a second surface layer where a bus signal is transmitted from the first to the second semiconductor package. A first bus wiring path from a signal terminal on an inner circumference side of the first semiconductor package via a via hole and the second surface layer to a signal terminal on an outer circumference side of the second semiconductor package and a second bus wiring path from a signal terminal on an outer circumference side of the first semiconductor package via the second surface layer and a via hole to a signal terminal on an inner circumference side of the second semiconductor package are provided, thus securing a return current path for a signal current and realizing a high density wiring while suppressing radiation noise.

9 Claims, 4 Drawing Sheets

(52) U.S. Cl.
CPC ......... *H01L2224/16225* (2013.01); *H01L 2225/06548* (2013.01); *H01L 2225/06555* (2013.01); *H01L 2924/15174* (2013.01); *H05K 1/0228* (2013.01); *H05K 1/0231* (2013.01); *H05K 2201/09654* (2013.01); *H05K 2201/10545* (2013.01); *H05K 2201/10734* (2013.01)

(56) References Cited

U.S. PATENT DOCUMENTS

| | | | | |
|---|---|---|---|---|
| 6,008,534 | A * | 12/1999 | Fulcher | H01L 23/49822 257/690 |
| 8,072,774 | B2 * | 12/2011 | Tokoro | H01P 3/08 174/255 |
| 2004/0118602 | A1 * | 6/2004 | Lee | H05K 1/162 174/260 |
| 2008/0308303 | A1 * | 12/2008 | Lehmann | H01L 21/486 174/255 |
| 2011/0273855 | A1 * | 11/2011 | Kim | H05K 1/0265 361/760 |

FOREIGN PATENT DOCUMENTS

| | | |
|---|---|---|
| JP | 2008-109094 A | 5/2008 |
| JP | 2009-038112 A | 2/2009 |

* cited by examiner

PRINTED CIRCUIT BOARD

CROSS-REFERENCE TO RELATED APPLICATIONS

This application is a continuation, and claims the benefit, of U.S. patent application Ser. No. 13/863,631, presently pending and filed on Apr. 16, 2013, and claims the benefit of Japanese Patent Application No. 2012-096100, filed Apr. 19, 2012, which applications are hereby incorporated by reference herein in their entireties.

BACKGROUND OF THE INVENTION

1. Field of the Invention

The present invention relates to a bus wiring formed on a printed circuit board.

2. Description of the Related Art

A higher speed in operations and a higher density of wirings are demanded for a printed circuit board along with sophistication of electronics devices in recent years. For that reason, a bus wiring is frequently used in which plural signal lines through which a signal can be transmitted at a high speed are arranged in parallel. In a case where the signals are transmitted by using the bus wiring from a transmission-side semiconductor package to a reception-side semiconductor package, lengths of respective wirings are set to be equal to each other. If a large difference exists in the lengths of the respective wirings, an operational timing of the reception-side semiconductor package is deviated, and noise is increased because of a difference in the timing at which the signals are reflected at connection points of the respective wirings.

In a case where the transmission-side semiconductor package is mounted on one of surfaces of a multi-layered printed wiring board and the reception-side semiconductor package is mounted on the other surface, the bus wiring is arranged by using via holes. A ground layer or a power supply layer is generally formed on an inter layer of the multi-layered printed wiring board, and the ground layer or the power supply layer serves as a return path for the signal flowing through the signal wiring such as the bus wiring.

The via holes are prepared also in the ground layer or the power supply layer in the case of the above-described multi-layered printed wiring board. To design the printed wiring board at a high density in recent years, the bus wirings are arranged to be adjacent to each other as much as possible. For that reasons, the via holes are also arranged to be adjacent to each other. However, if the via holes prepared in the ground layer or the power supply layer are continuously arranged, the return path for the signal is divided by the via holes. Thus, radiation noise is increased.

Japanese Patent Laid-Open No. 8-340161 discloses a configuration in which the via holes are prepared in a diagonal manner, or a wider interval is designed every two or four via holes in a case where the bus wirings are formed on the multi-layered printed wiring board. The return path is secured by preparing the via holes in the above-described manner.

In recent years, a semiconductor package of a ball grid array (BGA) type is used instead of a semiconductor package of the QFP type disclosed in Japanese Patent Laid-Open No. 8-340161. Accordingly, the following configuration with regard to electrode terminals connected to the bus wirings is more frequently used. That is, the bus wirings are connected to not only the electrode terminals arranged on an outermost circumference of the semiconductor package but also the electrode terminals arranged on an inner circumference of the semiconductor package. It is therefore difficult to arrange the bus wirings at equal distances.

When the number of bus wirings is increased in the case of the multi-layered printed wiring board, the number of the via holes prepared in the ground layer or the power supply layer of the signal wirings is increased, and it is difficult to secure the return path for the signal. As described in Japanese Patent Laid-Open No. 8-340161, even when the via holes are prepared in a diagonal manner, the area for preparing the via holes is enlarged, and a degree of freedom for the board design is largely impaired. That is, if the via holes are prepared in a diagonal manner, the area for mounting electronic components such as bypass capacitors is limited, and the area for forming the other signal wirings is also limited.

SUMMARY OF THE INVENTION

The present invention provides a printed circuit board with which radiation noise is reduced and a high density wiring is realized by securing a return current path with respect to a signal current.

According to an aspect of the present invention, there is provided a printed circuit board including a first semiconductor package mounted on a first surface layer of a printed wiring board and a second semiconductor package mounted on a second surface layer where a bus signal is transmitted from the first to the second semiconductor package, in which a first signal terminal group provided in the first semiconductor package is connected to a third signal terminal group provided in the second semiconductor package through a first via hole and a first bus wiring formed on the second surface layer, a second signal terminal group provided in the first semiconductor package is connected to a fourth signal terminal group provided in the second semiconductor package through a second bus wiring formed on the first surface layer and a second via hole, the second signal terminal group is a signal terminal group arranged on an outer circumference side with respect to the first signal terminal group in the first semiconductor package, and the third signal terminal group is a signal terminal group arranged on an outer circumference side with respect to the fourth signal terminal group in the second semiconductor package.

According to the aspect of the present invention, the high density wiring and the high density mounting of the printed circuit board can be realized while the radiation noise is reduced by securing the return path for the signal current.

Further features of the present invention will become apparent from the following description of exemplary embodiments with reference to the attached drawings.

DESCRIPTION OF THE EMBODIMENTS

Hereinafter, embodiments of the present invention will be described with reference to the drawings.

First Exemplary Embodiment

Figure 1:
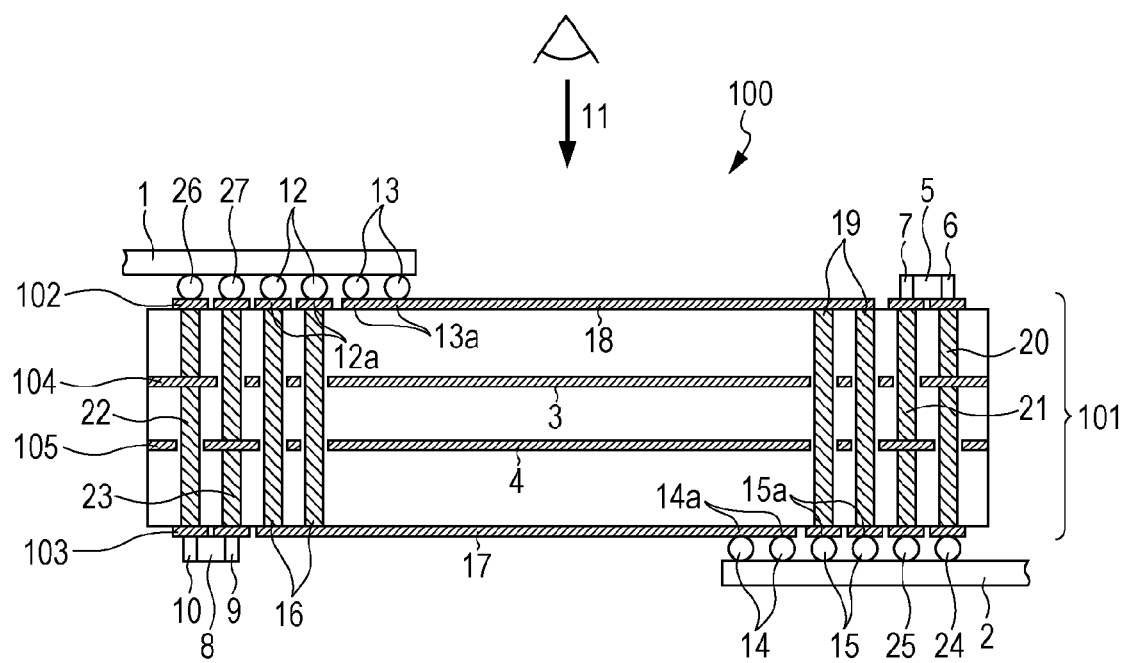
FIG. 1 is a cross sectional view of a multi-layered printed circuit board according to a first exemplary embodiment.

FIG. 1 is a cross sectional view of a multi-layered printed circuit board 100 having a four-layer structure according to a first exemplary embodiment of the present invention. In the multi-layered printed circuit board 100, a first semiconductor package 1 on a transmission side is mounted on a first signal layer 102 corresponding to a first layer (first surface layer) of a printed wiring board 101, and a second semiconductor package 2 on a reception side is mounted on a second signal layer 103 corresponding to a fourth layer (second surface layer). The second layer provided between the first layer and the fourth layer is a ground layer 104, and the third layer is a power supply layer 105. A ground pattern 3 is formed on the ground layer 104, and a power supply pattern 4 is formed on the power supply layer 105. The second layer may be set as the power supply layer 105, and the third layer may be set as the ground layer 104. The same applies when the second semiconductor package 2 is set as the transmission side, and the first semiconductor package 1 is set as the reception side.

The ground layer herein is a wiring layer on which a ground conductor is formed and is a conductive layer where the area of a conductor at a ground potential is relatively higher than the other wiring layer. Therefore, a wiring and a conductor plane at a power supply potential, the other signal wirings, and the like may also be provided in addition to the wiring and the conductor plane at the ground potential. The number of the ground conductor layer is not limited to one, and plural ground conductor layers may also be provided.

The power supply layer herein is a wiring layer on which a power supply conductor is formed and is a conductive layer where the area of a conductor at a power supply potential is relatively higher than the other wiring layer. Therefore, a wiring and a conductor plane at the ground potential, the other signal wirings, and the like may also be provided in addition to the wiring and the conductor plane at the power supply potential. The number of the power supply conductor layer is not limited to one, and plural power supply conductor layers may also be provided.

The signal layer herein is a conductive layer other than the ground layer and the power supply layer described above. A front surface layer (first surface layer) and a rear surface layer (second surface layer) of the multi-layered printed circuit board are generally composed of the signal layers, but the signal layer may be provided on an inner layer. The wiring and the conductor plane at the power supply potential or the ground potential may also be provided other than wirings through which the signals are transmitted.

The first semiconductor package 1 is mounted to the first signal layer 102 via plural ball electrodes. A ball electrode group 12 is a first signal terminal group connected to a bus wiring 17 which will be described below, and a ball electrode group 13 is a second signal terminal group connected to a bus wiring 18 which will be described below. A ball electrode 26 is a ground terminal and is connected to the ground pattern 3 via a via hole 22. A ball electrode 27 is a power supply terminal and is connected to the power supply pattern 4 via a via hole 23. A bypass capacitor 8 is provided. A capacitor terminal 10 is connected to the via hole 22, and a capacitor terminal 9 is connected to the via hole 23. The ball electrode group 12 is mounted to a first land group 12*a* formed on the first signal layer 102. The ball electrode group 13 is mounted to a second land group 13*a*.

The second semiconductor package 2 is mounted to the second signal layer 103 via plural ball electrodes. A ball electrode group 14 is a third signal terminal group connected to the bus wiring 17 which will be described below, and a ball electrode group 15 is a fourth signal terminal group connected to the bus wiring 18 which will be described below. A ball electrode 24 is a ground terminal and is connected to the ground pattern 3 via a via hole 20. A ball electrode 25 is a power supply terminal and is connected to the power supply pattern 4 via a via hole 21. A bypass capacitor 5 is provided, and a capacitor terminal 6 is connected to the via hole 20, and a capacitor terminal 7 is connected to the via hole 21. The ball electrode group 14 is mounted to a third land group 14*a* formed on the second signal layer 103. The ball electrode group 15 is mounted to a fourth land group 15*a*.

The ball electrode group 12 of the first semiconductor package 1 and the ball electrode group 14 of the second semiconductor package 2 are connected to each other via a first via hole 16 and the first bus wiring 17 formed on the second signal layer 103. The ball electrode group 13 of the first semiconductor package 1 and the ball electrode group 15 of the second semiconductor package 2 are connected to each other via the second bus wiring 18 formed on the first signal layer 102 and a second via hole 19.

A bus signal transmitted from the ball electrode group 12 to the ball electrode group 14 and a bus signal transmitted from the ball electrode group 13 to the ball electrode group 15 are the same bus signal. Therefore, a first bus wiring path defined by passing through the first via hole 16 and the first bus wiring 17 and a second bus wiring path defined by passing through the second bus wiring 18 and the second via hole 19 are one bus wiring path through which the same signal is transmitted. At this time, by setting a length and a width of the first bus wiring 17 to be equal to those of the second bus wiring 18, equal length wirings for the first bus wiring path and the second bus wiring path can be realized.

For the connection between the ball electrode group 12 of the first semiconductor package 1 and the first via hole 16, a connection wiring illustrated in FIG. 3A which will be described below can be used. The ball electrode group 12 can also be directly mounted on the first via hole 16 without using the connection wiring. Similarly, for the connection between the ball electrode group 15 of the second semiconductor package 2 and the second via hole 19, a connection wiring illustrated in FIG. 3D which will be described below can be used. The ball electrode group 15 can also be directly mounted on the second via hole 19 without using the connection wiring. A length of the wiring that connects the ball electrode group 12 to the first via hole 16 is preferably equal to a length of the wiring that connects the ball electrode group 15 to the second via hole 19.

Figure 2A:
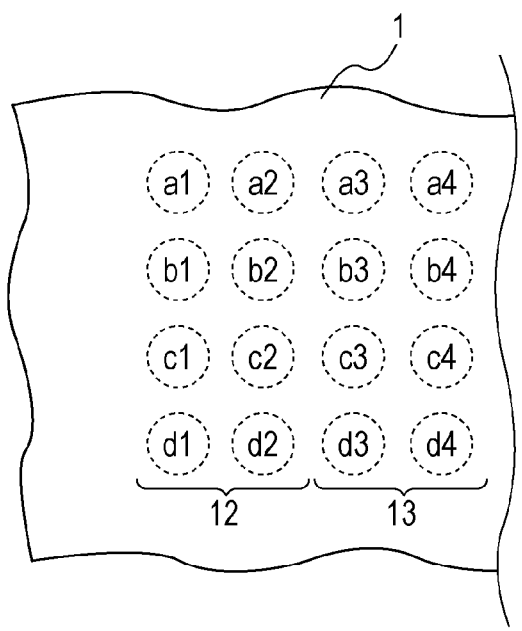
FIGS. 2A and 2B are plan views of terminal arrangements of semiconductor packages according to the first exemplary embodiment.
Figure 2B:
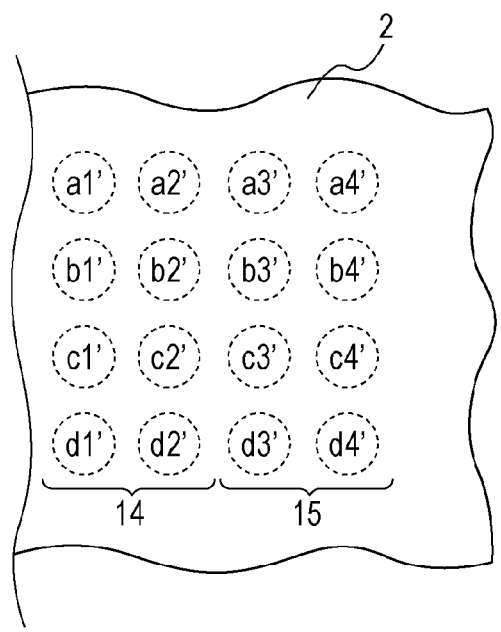

FIGS. 2A and 2B are plan views of terminal arrangements of the first semiconductor package 1 and the second semiconductor package 2 as viewed from an arrow 11 of FIG. 1 according to the first exemplary embodiment of the present invention.

FIG. 2A is the plan view where only the ball electrode group 12 of the first semiconductor package 1 and the ball electrode group 13 are enlarged. In FIG. 2A, the ball electrode group 13 is composed of electrodes a4, b4, c4, and d4 arranged on an outermost circumference of the first semiconductor package 1 and electrodes a3, b3, c3, and d3 arranged on a second circumference from the outermost circumference which is accordingly adjacent to the outermost circumference. The ball electrode group 12 is composed of electrodes a2, b2, c2, and d2 arranged on a third circumference from the outermost circumference and electrodes a1, b1, c1, and d1 arranged on a fourth circumference from the outermost circumference.

FIG. 2B is the plan view where only the ball electrode group 14 of the second semiconductor package 2 and the ball electrode group 15 are enlarged. In FIG. 2B, the ball electrode group 14 is composed of electrodes a1', b1', c1', and d1' arranged on an outermost circumference of the second semiconductor package 2 and electrodes a2', b2', c2', and d2' arranged on a second circumference from the outermost circumference which is accordingly adjacent to the outermost circumference. The ball electrode group 13 is composed of electrodes a3', b3', c3', and d3' arranged on a third circumference from the outermost circumference and electrodes a4', b4', c4', and d4' arranged on a fourth circumference from the outermost circumference. The electrodes a1, a2, b1, b2, c1, c2, d1, and d2 forming the ball electrode group 12 are connected to the electrodes a1', a2', b1', b2', c1', c2', d1', and d2' forming the ball electrode group 14 via the first via hole 16 and the first bus wiring 17. The electrodes a3, a4, b3, b4, c3, c4, d3, and d4 forming the ball electrode group 13 are connected to the electrodes a3', a4', b3', b4', c3', c4', d3', and d4' forming the ball electrode group 15 via the second bus wiring 18 and the second via hole 19.

Figure 3A:
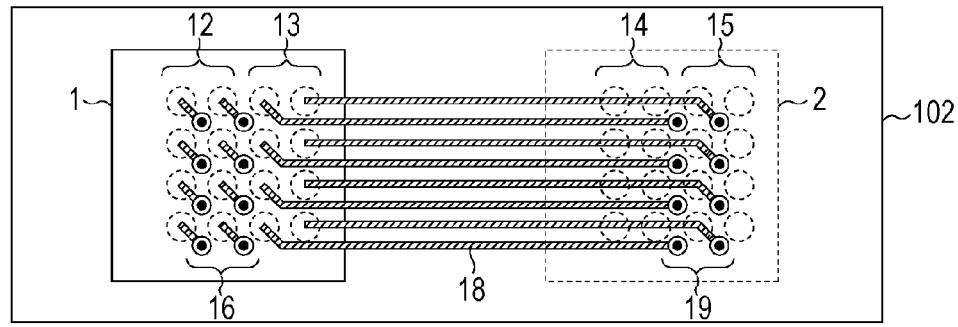
FIGS. 3A, 3B, 3C, and 3D are plan views of respective layers of the printed circuit board according to the first exemplary embodiment.
Figure 3B:
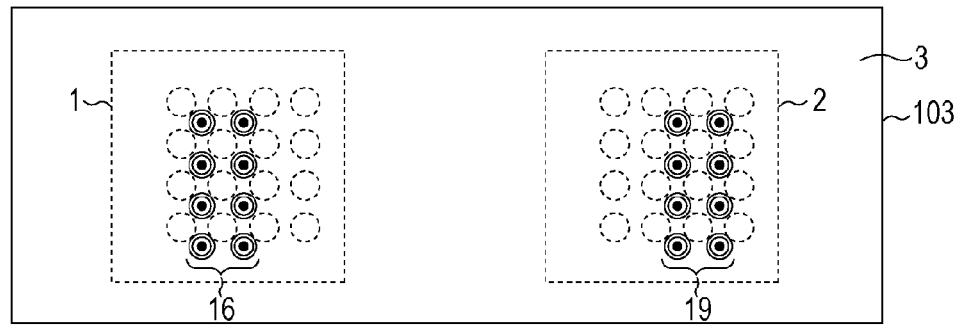
Figure 3C:
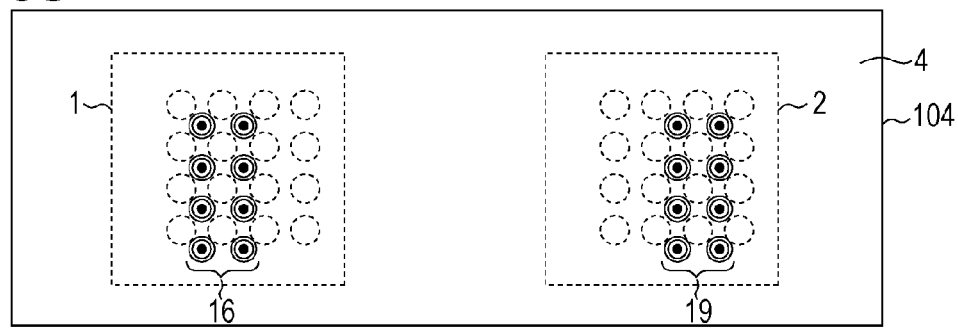
Figure 3D:
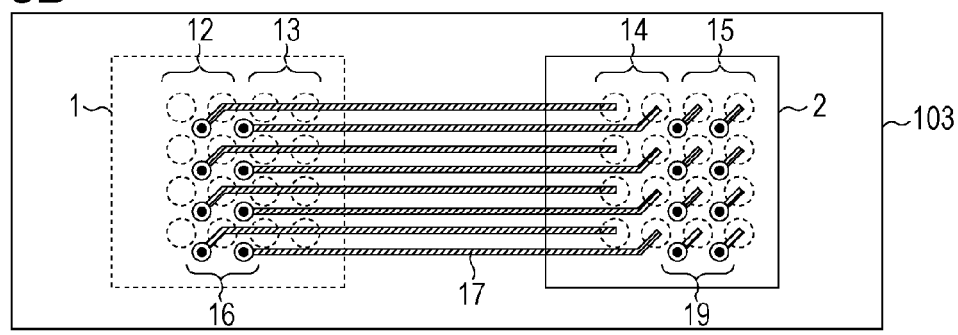

FIGS. 3A, 3B, 3C, and 3D are plan views of respective layers as viewed from the arrow 11 of FIG. 1 according to the first exemplary embodiment of the present invention. FIG. 3A illustrates the first signal layer 102 corresponding to the first layer (first surface layer), FIG. 3B illustrates the ground pattern 3 corresponding to the second layer, FIG. 3C illustrates the power supply pattern 4 corresponding to the third layer, and FIG. 3D illustrates the second signal layer 103 corresponding to the fourth layer (second surface layer). To simplify the description, in FIGS. 3A, 3B, 3C, and 3D, only peripheral parts of the ball electrode group 12 and the ball electrode group 13 are illustrated with regard to the first semiconductor package 1, and only peripheral parts of the ball electrode group 14 and the ball electrode group 15 are illustrated with regard to the second semiconductor package 2. Only the bus wirings 17 and 18 which are related to the embodiment of the present invention are illustrated with regard to the wirings.

With the above-described configuration, it is possible to set a signal transmission time for the bus signal to transmit through the first bus wiring path from the ball electrode group 12 to the ball electrode group 14 to be substantially equal to a signal transmission time for the bus signal to transmit through the second bus wiring path from the ball electrode group 13 to the ball electrode group 15. The first via hole 16 and the second via hole 19 are both prepared in mounting areas of the first semiconductor package 1 and the second semiconductor package 2, and a degree of freedom for a board design is not impaired. The state where the signal transmission times are equal to each other means that the signal from the first semiconductor package 1 to the second semiconductor package 2 via the first bus wiring path and the second bus wiring path is transmitted within a time error range in which the second semiconductor package 2 normally operates. The normal time error range is preferably 5% or below of a timing budget of the transmitted signal. That is, in the case of DDR3, the normal time error range is preferably 5% or below of a half-wave length of the transmitted signal.

It is possible to secure the return path at a shortest length for the signal transmitted through the first and second bus wiring paths by preparing the via holes 22 and 23 connected to the bypass capacitor 8 in the vicinity of the first via hole 16 through which the signal from the ball electrode group 12 is transmitted. It is therefore possible to largely contribute to the suppression of the radiation noise.

At this time, the return path is not disturbed by the via holes 20 and 21 by setting the arrangement of the ball electrodes 24 and 25 connected to the bypass capacitor 5 illustrated in FIG. 1 on an outer circumference side with respect to the ball electrode group 14. A similar effect can be obtained by setting the arrangement of the ball electrodes 26 and 27 connected to the bypass capacitor 8 on an outer circumference side with respect to the ball electrode group 13.

According to the present embodiment, the ball electrode group 13 is arranged on the outermost circumference of the first semiconductor package 1 and the second circumference from the outermost circumference, and the ball electrode group 12 is arranged on the third circumference and the fourth circumference from the outermost circumference. The present embodiment is not limited to the above, and the ball electrode group 13 may be arranged on an outer circumference side with respect to the ball electrode group 12. Similarly, the ball electrode group 14 is arranged on the outermost circumference of the second semiconductor package 2 and the second circumference from the outermost circumference, and the ball electrode group 15 is arranged on the third circumference and the fourth circumference from the outermost circumference. The present embodiment is not limited to the above, and the ball electrode group 14 may be arranged on an outer circumference side with respect to the ball electrode group 15. It is however noted that to set the equal transmission time for the first bus wiring path and the second bus wiring path, the ball electrode group 13 and the ball electrode group 14 as well as the ball electrode group 12 and the ball electrode group 15 are preferably arranged on the same circumferences from the outermost circumference of the semiconductor package.

Second Exemplary Embodiment

Figure 4:
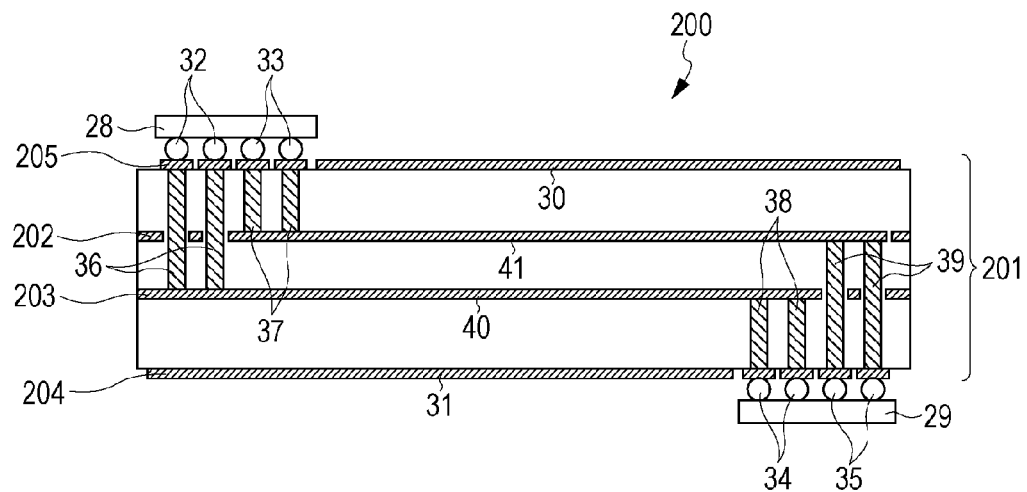
FIG. 4 is a cross sectional view of a printed circuit board according to a second exemplary embodiment.

FIG. 4 is a cross sectional view of a printed circuit board having a four-layer structure according to a second exemplary embodiment of the present invention. To simplify the description, only a part of semiconductor packages 28 and 29 which will be described below is illustrated.

FIG. 4 is a cross sectional view of a multi-layered printed circuit board 200 having a four-layer structure according to the second exemplary embodiment of the present invention. In the multi-layered printed circuit board 200, a first semiconductor package 28 on a transmission side is mounted on a power supply layer 205 corresponding to the first layer (first surface layer) of the printed wiring board 201, and a second semiconductor package 29 on a reception side is mounted on the ground layer 204 corresponding to the fourth layer (second surface layer). A power supply pattern 30 is formed on the power supply layer 205, and a ground pattern 31 is formed on the ground layer 204. The second layer provided between the first layer and the fourth layer is a first signal layer 202, and the third layer is a second signal layer 203. The fourth layer may be set as the power supply layer 205, and the first layer may be set as the ground layer 204.

The first semiconductor package 28 is mounted to the power supply layer 205 via plural ball electrodes. A ball electrode group 32 is a first signal terminal group connected to a bus wiring 40, and a ball electrode group 33 is a first signal terminal group connected to a bus wiring 41. The bus wirings 40 and 41 will be described below. The second semiconductor package 29 is mounted to the ground layer 204 via plural ball electrodes. A ball electrode group 34 is a third signal terminal group connected to the bus wiring 40, and a ball electrode group 35 is a fourth signal terminal group connected to the bus wiring 41.

The ball electrode group 32 of the first semiconductor package 28 and the ball electrode group 34 of the second semiconductor package 29 are connected to each other via a first via hole 36, the first bus wiring 40 formed on the second signal layer 203, and a third via hole 38. The ball electrode group 33 of the first semiconductor package 28 and the ball electrode group 35 of the second semiconductor package 29 are connected to each other via a second via hole 37, the second bus wiring 41 formed on the first signal layer 202, and a fourth via hole 39.

A signal transmitted from the ball electrode group 32 to the ball electrode group 34 and a signal transmitted from the ball electrode group 33 to the ball electrode group 35 are the same signal. Therefore, the first bus wiring path defined by passing through the first via hole 36, the first bus wiring 40, and the third via hole 38 and the second bus wiring path defined by passing through the second via hole 37, the second bus wiring 41, and the fourth via hole 39 are one bus wiring path through which the same signal is transmitted. At this time, by setting a length and a width of the first bus wiring 40 to be equal to those of the second bus wiring 41, the equal length wirings for the first bus wiring path and the second bus wiring path can be realized.

With the above-described configuration, it is possible to set a signal transmission time for the bus signal to transmit through the first bus wiring path from the ball electrode group 32 to the ball electrode group 34 to be substantially equal to the second bus wiring path through which the bus signal is transmitted from the ball electrode group 33 to the ball electrode group 35. The first via hole 36, the second via hole 37, the third via hole 38, and the fourth via hole 39 are all prepared in mounting areas of the first and second semiconductor packages 28 and 29, and a degree of freedom for a board design is not impaired.

The prepared via holes are non-penetrating via holes instead of the penetrating via holes according to the first exemplary embodiment. The structure in which no via holes exist in the return path for the transmission signal is realized by arranging the power supply pattern 30 and the ground pattern 31 on the first and second surface layers. That is, the return path of the first bus wiring path can be set as the ground pattern 31, and the return path of the second bus wiring path can be set as the power supply pattern 30. It is therefore possible to largely contribute to the suppression of the radiation noise.

Third Exemplary Embodiment

Figure 5:
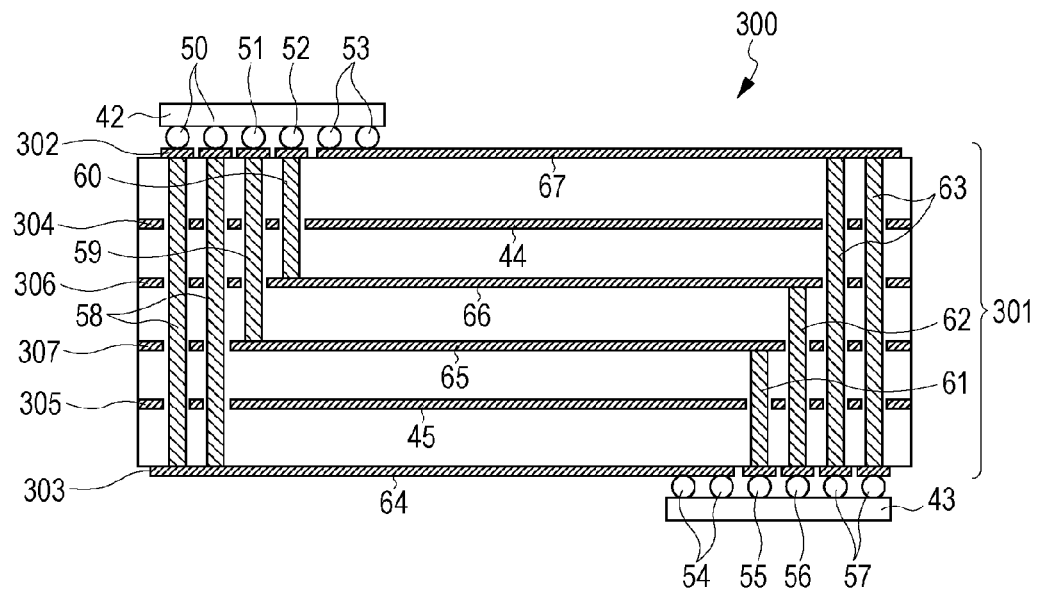
FIG. 5 is a cross sectional view of a printed circuit board according to a third exemplary embodiment.

The printed circuit board having the four-layer structure has been described according to the first and second exemplary embodiments. However, the embodiment of the present invention is not limited to the above and can be applied to a multi-layered printed circuit board having four or more layers. FIG. 5 illustrates a case of a printed circuit board having a six-layer structure.

FIG. 5 is a cross sectional view of a multi-layered printed circuit board 300 having a six-layer structure according to a third exemplary embodiment of the present invention. In the multi-layered printed circuit board 300, a first semiconductor package 42 on a transmission side is mounted on a first signal layer 302 corresponding to the first layer (first surface layer) of a printed wiring board 301, and a second semiconductor package 43 on a reception side is mounted on a second signal layer 303 corresponding to a sixth layer (second surface layer). The second layer arranged on an inner layer between the first layer and the sixth layer is the ground layer 304, and a fifth layer is a power supply layer 305. A ground pattern 44 is formed on the ground layer 304, and a power supply pattern 45 is formed on the power supply layer 305. The second layer may be set as the power supply layer 305, and the fifth layer may be set as the ground layer 304. The third layer is a third signal layer 306, and the fourth layer is a fourth signal layer 307.

The first semiconductor package 42 is mounted to the first signal layer 302 via plural ball electrodes. A ball electrode group 50 is a first signal terminal group connected to a bus wiring 64, and a ball electrode group 53 is a second signal terminal group connected to a bus wiring 67. A ball electrode group 51 is a fifth signal terminal group connected to a bus wiring 65, and a ball electrode group 52 is a seventh signal terminal group connected to a bus wiring 66. The bus wirings 64, 65, 66, and 67 will be described below. In the first semiconductor package 42, the ball electrode group 51 and the ball electrode group 52 are formed on an outer circumference side with respect to the ball electrode group 50 and on an inner circumference side with respect to the ball electrode group 53.

The second semiconductor package 43 is mounted to the second signal layer 303 via plural ball electrodes. A ball electrode group 54 is a third signal terminal group connected to the bus wiring 64, and a ball electrode group 57 is a fourth signal terminal group connected to the bus wiring 67. A ball electrode group 55 is a sixth signal terminal group connected to the bus wiring 65, and a ball electrode group 56 is an eighth signal terminal group connected to the bus wiring 66. In the second semiconductor package 43, the ball electrode group 55 and the ball electrode group 56 are formed on an outer circumference side with respect to the ball electrode group 57 and on an inner circumference side with respect to the ball electrode group 54.

The ball electrode group 50 of the first semiconductor package 42 and the ball electrode group 54 of the second semiconductor package 43 are connected to each other via the first via hole 58 and the first bus wiring 64 formed on the second signal layer 303. The ball electrode group 53 of the first semiconductor package 42 and the ball electrode group 57 of the second semiconductor package 43 are connected to each other via the second bus wiring 67 formed on the first signal layer 302 and a second via hole 63. The ball electrode group 51 of the first semiconductor package 42 and the ball electrode group 55 of the second semiconductor package 43 are connected to each other via a third via hole 59, the third bus wiring 65 formed on the fourth signal layer 307, and a fourth via hole 61. The ball electrode group 52 of the first semiconductor package 42 and the ball electrode group 56 of the second semiconductor package 43 are connected to each other via a fifth via hole 60, the fourth bus wiring 66 formed on the third signal layer 306, and a sixth via hole 62.

At this time, by setting lengths and widths of the first bus wiring 64, the second bus wiring 67, the third bus wiring 65, and the fourth bus wiring 66 to be equal to each other, it is possible to set a signal transmission time for the bus signal to transmit through the first bus wiring path from the ball electrode group 50 to the ball electrode group 54, a signal transmission time for the bus signal to transmit through the second bus wiring path from the ball electrode group 53 to the ball electrode group 57, a signal transmission time for the bus signal to transmit through the third bus wiring path from the ball electrode group 51 to the ball electrode group 55, and a signal transmission time for the bus signal to transmit through the fourth bus wiring path from the ball electrode group 52 to the ball electrode group 56 to be substantially equal to other. The first via hole 58, the third via hole 59, the fifth via hole 60, the fourth via hole 61, the sixth via hole 62, and the second via hole 63 are all prepared in mounting areas of the first and second semiconductor packages 42 and 43, and a degree of freedom for a board design is not impaired.

The return paths for the first bus wiring path and the third bus wiring path correspond to the power supply layer 305 adjacent to each of the bus wiring paths. The return paths for the second bus wiring path and the fourth bus wiring path correspond to the ground layer 304 adjacent to each of the bus wiring paths. Therefore, the return paths for the first bus wiring path and the third bus wiring path can be realized at a shortest distance. It is therefore possible to largely contribute to the suppression of the radiation noise.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A printed circuit board comprising:
    a first semiconductor package including a first signal terminal group and a second signal terminal group arranged on an outer circumference side with respect to the first signal terminal group;
    a second semiconductor package including a third signal terminal group and a fourth signal terminal group arranged on an inner circumference side with respect to the third signal terminal group and transmitting a bus signal with the first semiconductor package; and
    a printed wiring board in which the first semiconductor package is mounted on a first surface layer, the second semiconductor package is mounted on a second surface layer, and a first signal layer and a second signal layer are arranged on an inner layer which is different from the first surface layer and the second surface layer,
    wherein the first signal layer is provided to be closer to the second surface layer than the second signal layer,
    wherein a first bus wiring formed on the first signal layer is connected to the first signal terminal group provided in the first semiconductor package and the third signal terminal group provided in the second semiconductor package via a first via hole prepared in the printed wiring board, the first bus wiring formed on the first signal layer and a third via hole prepared in the printed wiring board, and
    wherein a second bus wiring formed on the second signal layer is connected to the second signal terminal group provided in the first semiconductor package and the fourth signal terminal group provided in the second semiconductor package via a second via hole prepared in the printed wiring board, the second bus wiring formed on the first signal layer and a fourth via hole prepared in the printed wiring board.

2. The printed circuit board according to claim 1,
    wherein at least a part of the second signal terminal group is arranged on an outermost circumference of the first semiconductor package, and at least a part of the third signal terminal group is arranged on an outermost circumference of the second semiconductor package.

3. The printed circuit board according to claim 1,
    wherein a transmission time for the bus signal to transmit through the first bus wiring path defined by passing through the first bus wiring is substantially equal to a transmission time for the bus signal to transmit through the second bus wiring path defined by passing through the second bus wiring.

4. The printed circuit board according to claim 1,
    wherein a length of the first bus wiring is substantially equal to a length of the second bus wiring.

5. The printed circuit board according to claim 1,
    wherein a third signal layer is provided between the first signal layer and the second signal layer, a third bus wiring is formed on the third signal layer, the third bus wiring is connected to a fifth signal terminal group provided in the first semiconductor package and a sixth signal terminal group provided in the second semiconductor package, the fifth signal terminal group is a signal terminal group arranged on an outer circumference side with respect to the first signal terminal group and on an inner circumference side with respect to the second signal terminal group in the first semiconductor package, and the sixth signal terminal group is a signal terminal group arranged on an outer circumference side with respect to the fourth signal terminal group and on an inner circumference side with respect to the third signal terminal group in the second semiconductor package.

6. The printed circuit board according to claim 5,
    wherein a length of the first bus wiring, a length of the second bus wiring, and a length of the third bus wiring are substantially equal to each other.

7. The printed circuit board according to claim 5,
    wherein a power supply terminal or a ground terminal is provided between the first signal layer and the third signal layer and between the second signal layer and the third signal layer.

8. A printed wiring board provided with a first surface layer, a second surface layer, a first signal layer and a second signal layer, the printed wiring board comprising:
    a first land group which is formed on the first surface layer and on which a first semiconductor package is mounted and a second land group arranged on an outer circumference side with respect to the first land group;
    a third land group which is formed on the second surface layer and on which a second semiconductor package is mounted and a fourth land group arranged on an inner circumference side with respect to the third land group;
    a first via hole connected to the first land group;
    a second via hole connected to the second land group;
    a third via hole connected to the third land group;
    a fourth via hole connected to the fourth land group;
    a first bus wiring which is formed on the first signal layer and which connects the first via hole to the third via hole; and
    a second bus wiring which is formed on the second signal layer and which connects the second via hole to the fourth via hole,
    wherein the first semiconductor package and the second semiconductor package transmit a bus signal through the first bus wiring path defined by passing through the first via hole, the first bus wiring and the third via hole, and the second bus wiring path defined by passing through the second via hole, the second bus wiring and the fourth via hole, and
    wherein the first signal layer and the second signal layer are arranged on inner layers which are different from the first surface layer and the second surface layer, and the first signal layer is provided to be closer to the second surface layer than the second signal layer.

9. The printed circuit board according to claim 8, wherein a length of the first via hole is substantially equal to a length of the fourth via hole, a length of the first bus wiring is substantially equal to a length of the second bus wiring, and a length of the third via hole is substantially equal to a length of the second via hole.

* * * * *